United States Patent [19]
Yagi et al.

[11] Patent Number: 6,025,640
[45] Date of Patent: Feb. 15, 2000

[54] RESIN-SEALED SEMICONDUCTOR DEVICE, CIRCUIT MEMBER FOR USE THEREIN AND METHOD OF MANUFACTURING RESIN-SEALED SEMICONDUCTOR DEVICE

[75] Inventors: Hiroshi Yagi; Masato Sasaki; Kazuyoshi Togashi, all of Tokyo, Japan

[73] Assignee: Dai Nippon Insatsu Kabushiki Kaisha, Tokyo, Japan

[21] Appl. No.: 09/111,374

[22] Filed: Jul. 7, 1998

[30] Foreign Application Priority Data

Jul. 16, 1997 [JP] Japan .................................. 9-205520
Feb. 10, 1998 [JP] Japan ................................. 10-044663

[51] Int. Cl.⁷ ................................................ H01L 23/495
[52] U.S. Cl. ........................... 257/666; 257/676; 257/691; 257/687; 257/675; 257/678; 438/123; 438/124; 438/108; 361/808; 361/813
[58] Field of Search ...................... 257/666, 676, 257/670, 671, 672, 673, 675, 687, 689, 690, 691, 692, 694; 438/123, 124, 108; 361/808, 813

[56] References Cited

U.S. PATENT DOCUMENTS 5,592,025  1/1997  Clark et al. .............................. 257/774
5,635,755  6/1997  Kinghorn ................................. 257/666

Primary Examiner—Tom Thomas
Assistant Examiner—Luan Thai
Attorney, Agent, or Firm—Oblon, Spivak, McClelland, Maier & Neustadt, P.C.

[57] ABSTRACT

There is disclosed a resin-sealed semiconductor device which comprises plural terminal portions integrally having inner terminals on surfaces and outer terminals on back surfaces and being disposed electrically independent of one another in such a manner that inner terminal surfaces are positioned on substantially the same plane; a die pad integrally provided with plural inner terminals on a surface and plural outer terminals on a back surface and being disposed electrically independently in a substantially center portion of the plane in which the plural terminal portions are arranged two-dimensionally; a semiconductor element electrically insulated and mounted on a surface of the die pad; and wires for connecting the inner terminals of the terminal portions and terminals of the semiconductor element. The whole is sealed with a resin in such a manner that the outer terminals of the terminal portions are partially exposed to the outside. In the device, the outer terminals integrally formed on the back surface of the die pad function as a heat release path for allowing heat generated on a circuit forming face of the semiconductor element to escape to the outside, and also function as ground terminals. Furthermore, when the die pad is divided into plural die pad pieces, the outer terminals provided on the back surfaces of the die pad pieces function as power terminals in addition to the aforementioned functions. Moreover, by forming outer electrodes on the outer terminals, a BGA (Ball Grid Array) type semiconductor device can be provided.

14 Claims, 16 Drawing Sheets

RESIN-SEALED SEMICONDUCTOR DEVICE, CIRCUIT MEMBER FOR USE THEREIN AND METHOD OF MANUFACTURING RESIN-SEALED SEMICONDUCTOR DEVICE

BACKGROUND OF THE INVENTION (i) Field of the Invention

The present invention relates to a resin-sealed semiconductor device with a semiconductor element mounted thereon, a circuit member for use therein and a method of manufacturing a resin-sealed semiconductor device.

(ii) Description of the Related Art

Recently, there has been a tendency (trend) toward the progress of technique for high integration and miniaturization and toward the sophistication and lightening/shortening of electrical equipment. Therefore, semiconductor devices represented by ASIC of LSI have increasingly advanced in high integration and high function. In the highly-integrated and sophisticated semiconductor devices, to process signals at a high speed, the heat developed in chips and the inductance in packages cannot be ignored. To solve the problem, the heat of the chip is allowed to escape from the package by providing a thermal via or the inductance is substantially lowered by increasing the number of power or ground connection terminals. The inductance in the package is reduced in this manner. The high integration and sophistication of the semiconductor devices result in an increase of the number of outer terminals (pins) and further a demand for the provision of multiple terminals (pins).

To meet the demand for multiple terminals (pins), a lead frame is used in the manufacture of a multiple terminal (pin) IC, ASIC especially represented by a gate array or a standard cell, DSP (Digital Signal Processor) or another semiconductor device. Specifically, there is provided a QFP (Quad Flat Package) or another surface mounting type package, and the QFP has even a 300-pin class for practical use.

However, the high speed operation and high performance (function) of the signal processing of a recent semiconductor element require more terminals. In QFP, by narrowing outer terminal pitches, further multiple terminals can be arranged. When the outer terminals have narrow pitches, however, the width of each outer terminal itself needs to be narrowed, thereby lowering an outer terminal strength. As a result, a problem arises in position accuracy or flatness accuracy when the terminals are formed. Furthermore, in QFP, as the outer terminal pitch is further narrowed to 0.3–0.4 mm, a mounting process is complicated, sophisticated board mounting process needs to be realized and another fault (problem) arises.

Moreover, to meet a demand for the miniaturizing/thinning of a sealed type semiconductor device using a lead frame, the trend of development has progressed via the surface mounting type package such as QFP and SOJ (Small Outline J-Leaded Package) to the miniaturization of a package mainly by thinning the package and developing TSOP (Thin Small Outline Package) and further to a structure of LOC (Lead On Chip) obtained by three-dimensionally constructing the inside of a package to enhance a chip containing efficiency.

In the conventional package described above, however, since leads are drawn around in an outer peripheral portion of a semiconductor element, the miniaturization of the package is limited. Furthermore, in the small package such as TSOP and the like, the provision of multiple pins is also limited in respect of the drawing-around of leads and the pin pitch. On the other hand, the resin-sealed type semiconductor device package is requested to be further highly integrated and sophisticated. Accordingly, there are demands for the high heat-release characteristics of the package and the decrease of lead inductance in the package in addition to demands for further multiple pins on the package and the thinning and miniaturizing of the package.

SUMMARY OF THE INVENTION

Wherefore, an object of the invention is to realize a resin-sealed semiconductor device which has a high occupation ratio of a semiconductor element and can miniaturize the semiconductor element, enhance a mounting density onto a circuit board and further provide multiple pins and which can be operated at a high speed while providing high heat-release characteristics and a low inductance; a circuit member for use in the resin-sealed semiconductor device; and a method of manufacturing the resin-sealed semiconductor device.

To attain this and other objects, the invention provides a resin-sealed semiconductor device in which plural terminal portions integrally having inner terminals on surfaces and outer terminals on back surfaces are disposed two-dimensionally in substantially the same plane and electrically independent of one another, the inner terminals of the terminal portions are electrically connected to terminals of a semiconductor element with wires and the whole is sealed with a resin in such a manner that the outer terminals of the terminal portions are partially exposed to the outside. In the device, a die pad integrally provided with plural inner terminals on a surface and plural outer terminals on a back surface is electrically independently disposed on a substantially center portion of the plane in which the terminal portions are two-dimensionally arranged, and the semiconductor element is electrically insulated and mounted on the surface of the die pad.

The invention also provides a resin-sealed semiconductor device in which plural terminal portions integrally having inner terminals on surfaces and outer terminals on back surfaces are disposed two-dimensionally in substantially the same plane and electrically independent of one another, the inner terminals of the terminal portions are electrically connected to terminals of a semiconductor element with wires and the whole is sealed with a resin in such a manner that the outer terminals of the terminal portions are partially exposed to the outside. The device has a die pad electrically independently disposed on a substantially center portion of the plane in which the terminal portions are two-dimensionally arranged, the die pad is constituted of plural die pad pieces arranged electrically independently, the die pad pieces are integrally provided with inner terminals on surfaces and outer terminals on back surfaces, and the semiconductor element is electrically insulated and mounted on the surface of the die pad.

The invention further provides a circuit member which comprises an outer frame member, plural terminal portions extended from the outer frame member via connection leads independent of one another and a die pad extended from the outer frame member via connection leads. The terminal portions integrally have inner terminals on surfaces and outer terminals on back surfaces, inner terminal surfaces of the terminal portions are positioned on substantially the same plane, and the die pad is integrally provided with plural inner terminals on a surface and plural outer terminals on a back surface.

The invention also provides a circuit member which comprises an outer frame member, plural terminal portions extended from the outer frame member via connection leads independent of one another and a die pad extended from the outer frame member via connection leads. The terminal portions integrally have inner terminals on surfaces and outer terminals on back surfaces, inner terminal surfaces of the terminal portions are positioned on substantially the same plane, and the die pad is constituted by arranging plural die pad pieces extended via connection leads from the outer frame member apart from one another on the same plane, and the die pad pieces are integrally provided with inner terminals on surfaces and outer terminals on back surfaces.

The invention provides a method of manufacturing a resin-sealed semiconductor device in which plural terminal portions integrally having inner terminals on surfaces and outer terminals on back surfaces are disposed two-dimensionally in substantially the same plane and electrically independent of one another, the inner terminals of the terminal portions are electrically connected to terminals of a semiconductor element with wires and the whole is sealed with a resin in such a manner that the outer terminals of the terminal portions are partially exposed to the outside. The method comprises:

(A) a circuit member preparing process of etching a conductive board to prepare a circuit member comprising plural terminal portions integrally having inner terminals on surfaces and outer terminals on back surfaces, a die pad integrally provided with plural inner terminals on a surface and plural outer terminals on a back surface and an outer frame member integrally interconnected via connection leads to the terminal portions independent of one another and integrally interconnected via connection leads to the die pad;

(B) a semiconductor element mounting process of electrically insulating, fixing and mounting the semiconductor element onto the die pad;

(C) a wire bonding process of electrically connecting the terminals of the semiconductor element and the inner terminals of the circuit member with wires;

(D) a resin sealing process of sealing the whole with the resin in such a manner that the outer terminals are partially exposed to the outside; and (E) an outer frame member separating and removing process of cutting the connection leads of the circuit member to remove the outer frame member.

The invention also provides a method of manufacturing a resin-sealed semiconductor device in which plural terminal portions integrally having inner terminals on surfaces and outer terminals on back surfaces are disposed two-dimensionally in substantially the same plane and electrically independent of one another, the inner terminals of the terminal portions are electrically connected to terminals of a semiconductor element with wires and the whole is sealed with a resin in such a manner that the outer terminals of the terminal portions are partially exposed to the outside. The method comprises:

(A) a circuit member preparing process of etching a conductive board to prepare a circuit member comprising plural terminal portions integrally having inner terminals on surfaces and outer terminals on back surfaces, a die pad constituted by arranging plural die pad pieces integrally provided with inner terminals on surfaces and outer terminals on back surfaces apart from one another and an outer frame member integrally interconnected via connection leads to the terminal portions independent of one another and integrally interconnected via connection leads to the die pad pieces independent of one another;

(B) a semiconductor element mounting process of electrically insulating, fixing and mounting the semiconductor element onto the die pad;

(C) a wire bonding process of electrically connecting the terminals of the semiconductor element and the inner terminals of the circuit member with wires;

(D) a resin sealing process of sealing the whole with the resin in such a manner that the outer terminals are partially exposed to the outside; and (E) an outer frame member separating and removing process of cutting the connection leads of the circuit member to remove the outer frame member.

In the aforementioned invention, the occupation ratio of the semiconductor element is raised, miniaturization is possible and the mounting density onto the circuit board can be enhanced. Moreover, the outer terminals integrally provided on the back surface of the die pad serve as heat-release paths, thereby remarkably enhancing the heat-release properties of the semiconductor device. Furthermore, since the number of ground connection terminals can be increased by the aforementioned outer terminals, the lead inductance in the package can be reduced. Additionally, when the die pad is divided into plural die pad pieces, the outer terminals integrally provided on the back surfaces of the die pad pieces can also increase the number of power connection terminals. Therefore, the circuit board can be operated at a high speed. Moreover, by forming outer electrodes on the outer terminals, a BGA (Ball Grid Array) type semiconductor device can be provided. Mounting operation properties and short-circuit preventive properties are enhanced. Furthermore, multiple pins can be provided. Additionally, by using the circuit member of the invention, the resin-sealed semiconductor device having the aforementioned effects can be easily prepared. The resin-sealed semiconductor device of the invention can be easily manufactured in the manufacture method of the invention.

DETAILED DESCRIPTION OF THE PREFERRED EMBODIMENTS

Preferred embodiments of the invention will be described with reference to the accompanying drawings.

Resin-sealed Semiconductor Device

A resin-sealed semiconductor device of the invention will be described.

Figure 1:
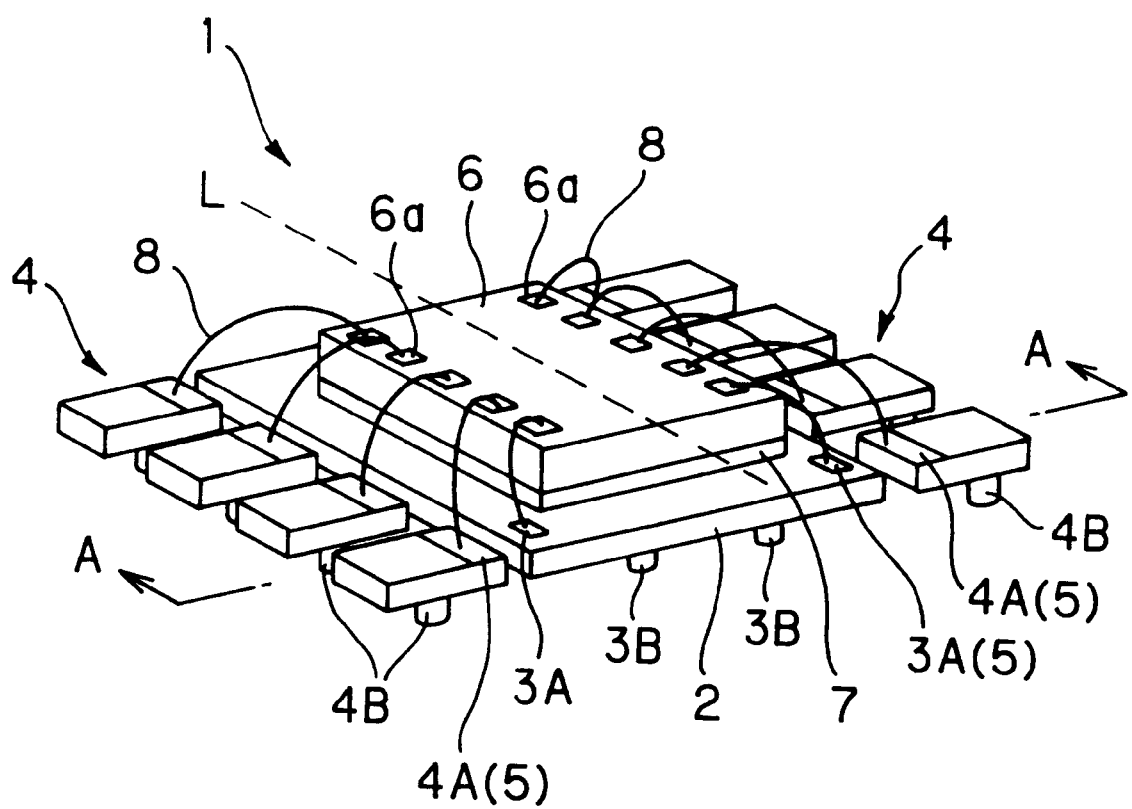
FIG. 1 is a perspective view showing an embodiment of a resin-sealed semiconductor device according to the invention.
Figure 2:
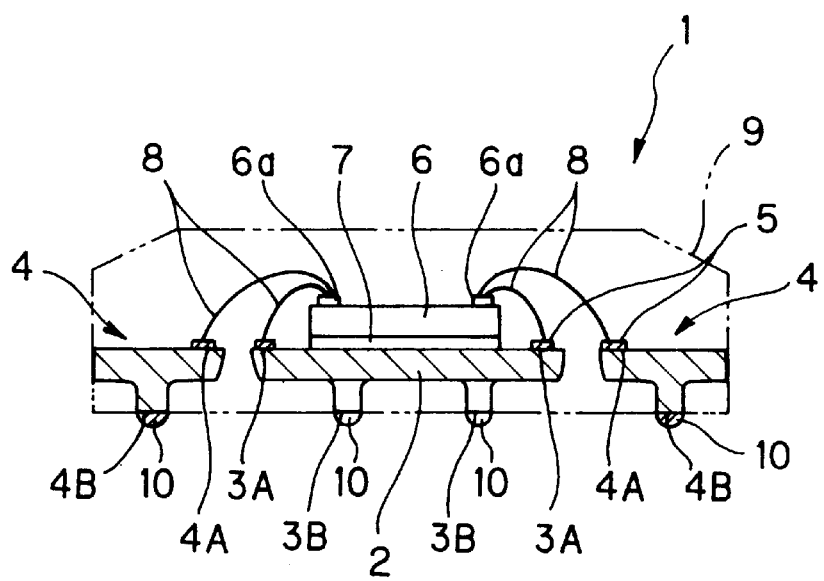
FIG. 2 is a longitudinal sectional view of the resin-sealed semiconductor device taken along line A—A in FIG. 1.
Figure 3:
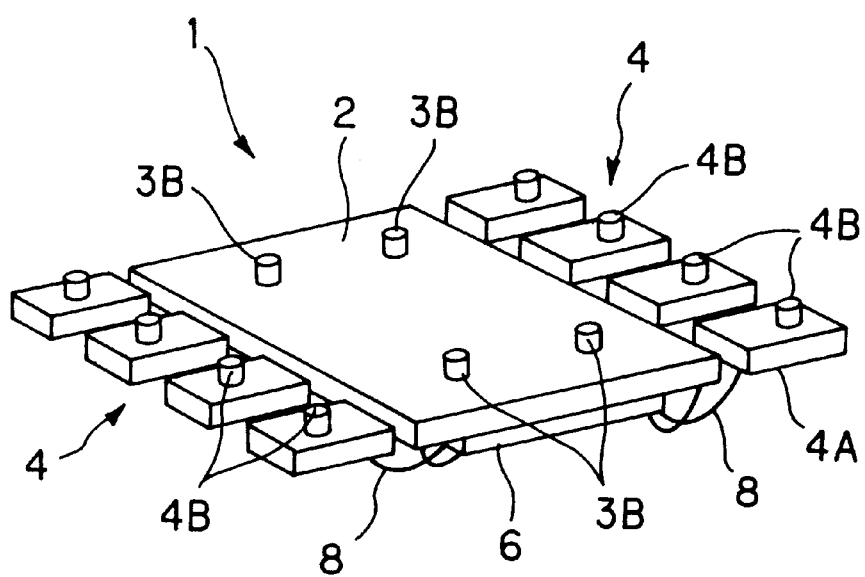
FIG. 3 is a perspective view of the resin-sealed semiconductor device of FIG. 1 seen from a rear side.

FIG. 1 is a perspective view showing a resin-sealed semiconductor device according to a first embodiment of the invention, FIG. 2 is a longitudinal sectional view of the semiconductor device taken along line A—A in FIG. 1, and FIG. 3 is a perspective view of the semiconductor device of FIG. 1 seen from a rear side. Furthermore, to facilitate the understanding of a constitution of the semiconductor device, a sealing member 9 described later is omitted from FIGS. 1 and 3, and FIG. 2 shows the sealing member 9 with a virtual line (two-dot chain line). Additionally, a sectional configuration of FIG. 2 is shown by considering actual etching characteristics.

In FIGS. 1 to 3, in a resin-sealed semiconductor device 1 of the invention, a face opposite to a terminal face of a semiconductor element 6 is fixed and mounted via an adhesive double coated tape 7 having electrical insulating properties onto a surface of a die pad 2 which has a rectangular surface configuration. Terminals 6a of the mounted semiconductor element 6 are disposed on a pair of sides of the terminal face of the semiconductor element 6 along substantially the center line (chain line L shown in FIG. 1) between the sides. Plural terminal portions 4 are disposed along a longitudinal direction of the die pad 2 in such a manner that the die pad 2 is placed between the terminal portions 4, and are electrically independently disposed two-dimensionally in substantially the same plane. Specifically, the terminal portions 4 are disposed along each of the opposite sides of the terminal face of the semiconductor element 6 in such a manner that the center line L is placed between the opposite sides.

A surface (mounting face of the semiconductor element 6) of the die pad 2 is integrally provided with plural inner terminals 3A, and a back surface thereof is integrally provided with plural outer terminals 3B. As shown in FIG. 1, silver plating layers 5 are disposed on the inner terminals 3A. Additionally, in the embodiment, as shown in FIG. 3, the outer terminals 3B are provided in two lines and two rows integrally on the back surface of the die pad 2, and there are four terminals in total, but the invention is not restricted to the embodiment.

The terminal portions 4 integrally have inner terminals 4A on surfaces and outer terminals 4B on back surfaces thereof. In the embodiment, as shown in FIG. 1, the silver plating layers 5 are formed on the inner terminals 4A. The inner terminals 4A and the inner terminals 3A of the die pad 2 are positioned on substantially the same plane.

The terminals 6a of the semiconductor element 6 mounted on the die pad 2 are connected to the inner terminals 3A (the silver plating layers 5) of the die pad 2 and the inner terminals 4A (the silver plating layers 5) of the terminal portions 4 via wires 8.

The die pad 2, the terminal portions 4, the semiconductor element 6 and the wires 8 are sealed in the sealing member 9 in such a manner that each of the outer terminals 4B is partially exposed to the outside. The sealing member 9 can be formed by using a known resin material which is usually used in the sealed type semiconductor device. In the embodiment shown in FIG. 2, outer electrodes 10 constituted of solders are disposed on the outer terminals 4B exposed to the outside. Thereby, a BGA (Ball Grid Array) type semiconductor device is formed.

In the semiconductor device 1, heat generated by the semiconductor element 6 is transmitted to the die pad 2 having a high thermal conductivity. Subsequently, the heat is efficiently removed from the outer terminals 3B of the die pad 2. Therefore, the heat dissipation properties of the resin-sealed semiconductor device 1 becomes remarkably excellent. Moreover, since the die pad 2 is provided with the outer terminals 3B, the number of ground connecting terminals can be increased, and the lead inductance of the resin-sealed semiconductor device 1 can be reduced.

Furthermore, the number of the terminals in the resin-sealed semiconductor device 1, the arrangement of the terminals and the like are shown by way of illustration, and it is natural that the invention is not restricted to the embodiment. For example, by two-dimensionally disposing the terminals 6a along four sides of the semiconductor element 6 and two-dimensionally disposing the terminal portions 4 around the semiconductor element 6 (the die pad 2), the resin-sealed semiconductor device 1 can be provided with more pins.

Figure 4:
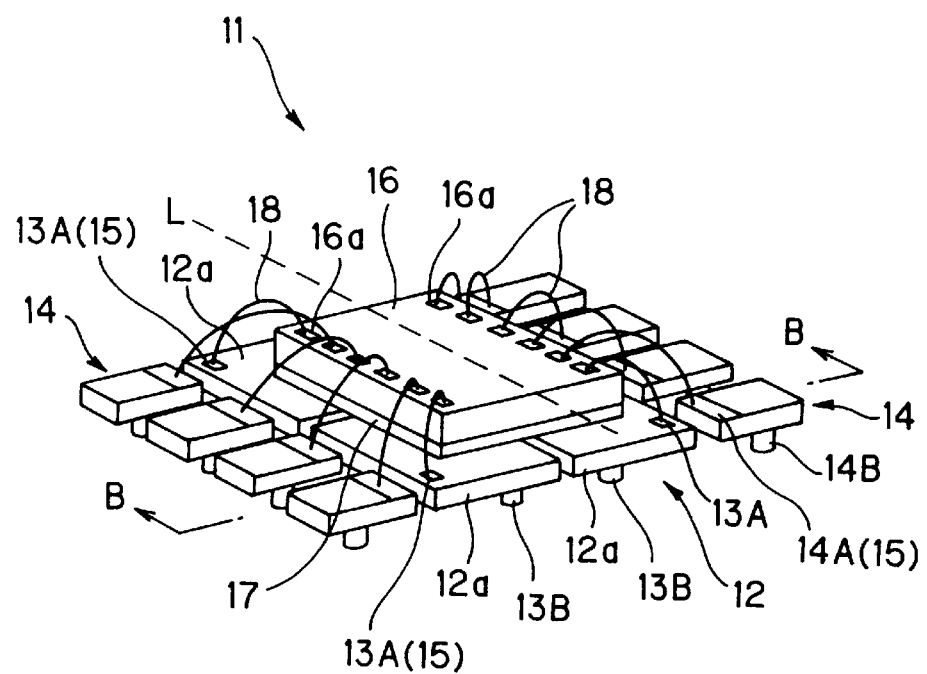
FIG. 4 is a perspective view showing another embodiment of the resin-sealed semiconductor device according to the invention.
Figure 5:
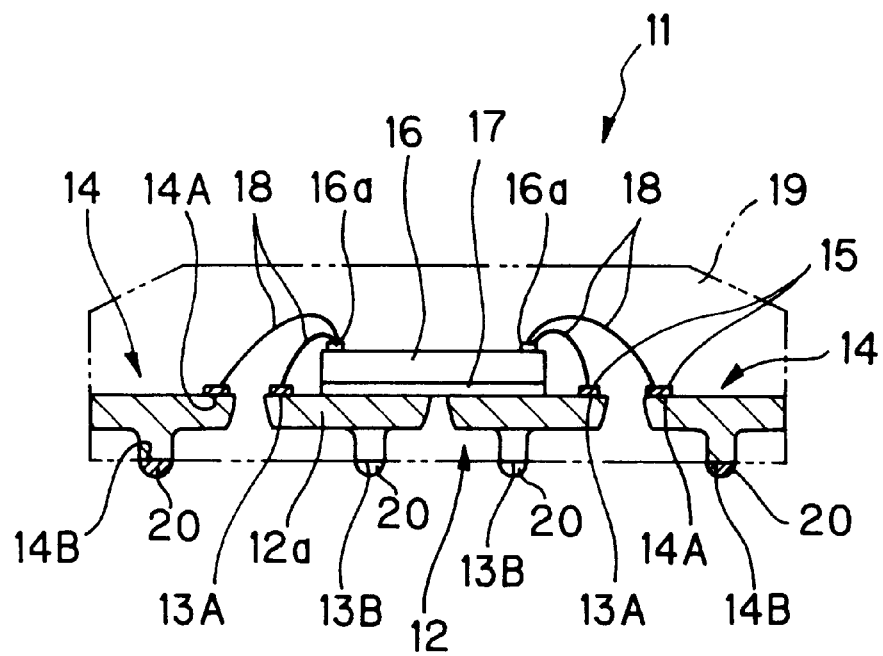
FIG. 5 is a longitudinal sectional view of the resin-sealed semiconductor device taken along line B—B in FIG. 4.
Figure 6:
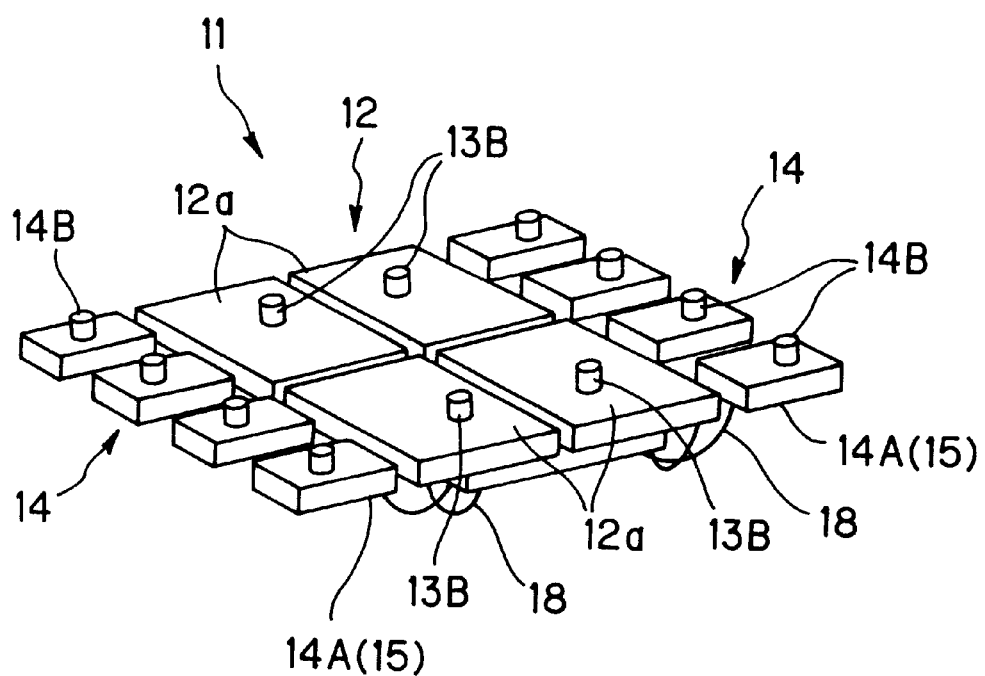
FIG. 6 is a perspective view of the resin-sealed semiconductor device of FIG. 4 seen from a rear side.

FIG. 4 is a perspective view showing a resin-sealed semiconductor device according to another embodiment of the invention, FIG. 5 is a longitudinal sectional view of the semiconductor device taken along line B—B in FIG. 4, and FIG. 6 is a perspective view of the semiconductor device of FIG. 4 seen from a rear side. Furthermore, to facilitate the understanding of a constitution of the semiconductor device, a sealing member 19 described later is omitted from FIGS. 4 and 6, and FIG. 5 shows the sealing member 19 with a virtual line (two-dot chain line). Additionally, a sectional configuration of FIG. 5 is shown by considering actual etching characteristics.

In FIGS. 4 to 6, in a resin-sealed semiconductor device 11 of the invention, a face opposite to a terminal face of a semiconductor element 16 is fixed and mounted via an adhesive double coated tape 17 having electrical insulating properties onto a surface of a die pad 12 which is constituted by disposing plural (four in the figures) die pad pieces 12a with rectangular surface configurations electrically independently. Terminals 16a of the mounted semiconductor element 16 are disposed on a pair of sides of the terminal face of the semiconductor element 16 along substantially the center line (chain line L shown in FIG. 4) between the sides. Plural terminal portions 14 are disposed along a longitudinal direction of the die pad 12 in such a manner that the die pad 12 is placed between the terminal portions 14, and are electrically independently disposed two-dimensionally in substantially the same plane. Specifically, the terminal portions 14 are disposed along each of the opposite sides of the terminal face of the semiconductor element 16 in such a manner that the center line L is placed between the opposite sides.

A surface (mounting face of the semiconductor element 16) of each die pad piece 12a constituting the die pad 12 is integrally provided with inner terminal 13A, and a back surface thereof is integrally provided with outer terminal 13B. As shown in FIG. 4, silver plating layers 15 are disposed on the inner terminals 13A. Additionally, in the embodiment, as shown in FIG. 6, the die pad pieces 12a constituting the die pad 12 are provided in two lines and two rows, and there are four die pad pieces in total, but the invention is not restricted to the embodiment.

The terminal portions 14 integrally have inner terminals 14A on surfaces and outer terminals 14B on back surfaces thereof. In the embodiment, as shown in FIG. 4, the silver plating layers 15 are formed on the inner terminals 14A. The inner terminals 14A and the inner terminals 13A of the die pad 12 are positioned on substantially the same plane.

The terminals 16a of the semiconductor element 16 mounted on the die pad 12 are connected to the inner terminals 13A (the silver plating layers 15) of the die pad pieces 12a and the inner terminals 14A (the silver plating layers 15) of the terminal portions 14 via wires 18.

The die pad 12, the terminal portions 14, the semiconductor element 16 and the wires 18 are sealed in the sealing member 19 in such a manner that each of the outer terminals 14B is partially exposed to the outside. The sealing member 19 can be formed by using a known resin material which is usually used in the sealed type semiconductor device. In the embodiment shown in FIG. 5, outer electrodes 20 constituted of solders are disposed on the outer terminals 14B exposed to the outside. Thereby, a BGA (Ball Grid Array) type semiconductor device is formed.

In the semiconductor device 11, heat generated by the semiconductor element 16 is transmitted to the die pad pieces 12a having high thermal conductivity. Subsequently, the heat is efficiently removed from the outer terminals 13B of the die pad pieces 12a. Therefore, the heat dissipation properties of the semiconductor device 11 becomes remarkably excellent. Moreover, since the die pad 12 is provided with the plural outer terminals 13B, the number of ground and power connecting terminals can be increased, and the semiconductor device 11 can be operated at high speeds.

Furthermore, the number of the terminals in the resin-sealed semiconductor device 11, the arrangement of the terminals and the like are shown by way of illustration, and it is natural that the invention is not restricted to the embodiment. For example, by two-dimensionally disposing the terminals 16a along four sides of the semiconductor element 16 and two-dimensionally disposing the terminal portions 14 around the semiconductor element 16 (the die pad 12), the resin-sealed semiconductor device 11 can be provided with more pins.

In the resin-sealed semiconductor device of the invention as shown in FIGS. 1 to 6, when the die pad 2 or 12 or the terminal portion 4 or 14 is constituted of a copper or copper alloy material, a nickel plating layer and a palladium plating layer are laminated in sequence on at least a resin sealed region. In this case, a rough-surface processing is performed on a surface of the copper or copper alloy material, and the nickel plating layer and the palladium plating layer are formed in sequence on the surface. By disposing the palladium plating layer, the adhesive properties are enhanced as compared with when the sealing resin material directly abuts on the copper or copper alloy material. Furthermore, the nickel plating layer prevents the copper from being diffused to a bonding face during wire bonding, and serves as a base layer for laminating the palladium on the copper or copper alloy material.

As the rough-surface processing of the copper or copper alloy material, a chemical polishing process can be performed in which the surface is etched with an organic acidic etching liquid or the like to form fine irregularities on the surface, but the invention is not restricted to the embodiment.

By setting a center-line average roughness Ra according to JIS B0601 of the surface of the copper or copper alloy material to 1.0 μm or more through the rough-surface processing, especially the adhesion of the copper or copper alloy material to the nickel plating layer is enhanced. Furthermore, by setting the center-line average roughness Ra according to JIS B0601 of the surface of the nickel plating layer to 0.045 μm or more, especially the adhesion of the nickel plating layer with the palladium plating layer is enhanced.

Additionally, when the nickel plating layer and the palladium plating layer are formed in sequence on the copper or copper alloy material as aforementioned, a plating layer of silver or another noble metal may be formed on the palladium plating layer in a wire bonding region or a die bonding region.

Moreover, when the die pad 2 or 12 or the terminal portion 4 or 14 is formed of an iron alloy material like a 42 alloy (iron alloy containing 41% of nickel), not of the copper or copper alloy material, the palladium plating layer may be formed directly on the iron alloy material. In this case, by setting the center-line average roughness Ra according to JIS B0601 of the surface of the iron alloy material to 0.1 μm or more through the rough-surface processing, the adhesion of the iron alloy material to the palladium plating layer is preferably enhanced.

Circuit Member

A circuit member of the invention will be described.

Figure 7:
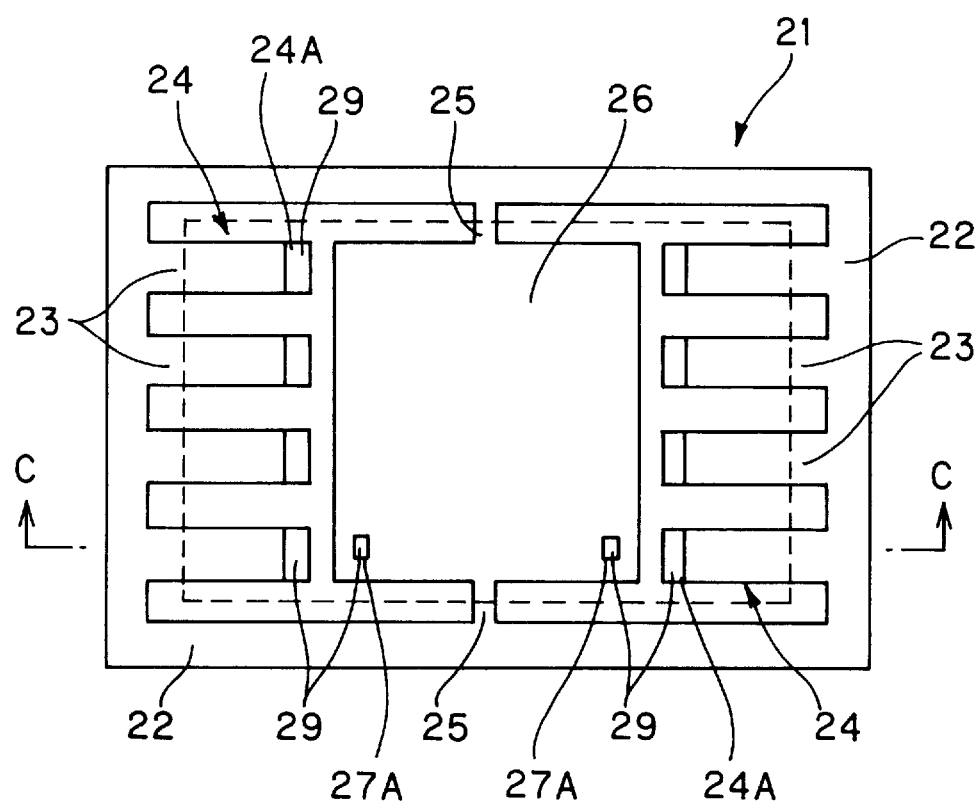
FIG. 7 is a plan view showing an embodiment of a circuit member of the invention.
Figure 8:
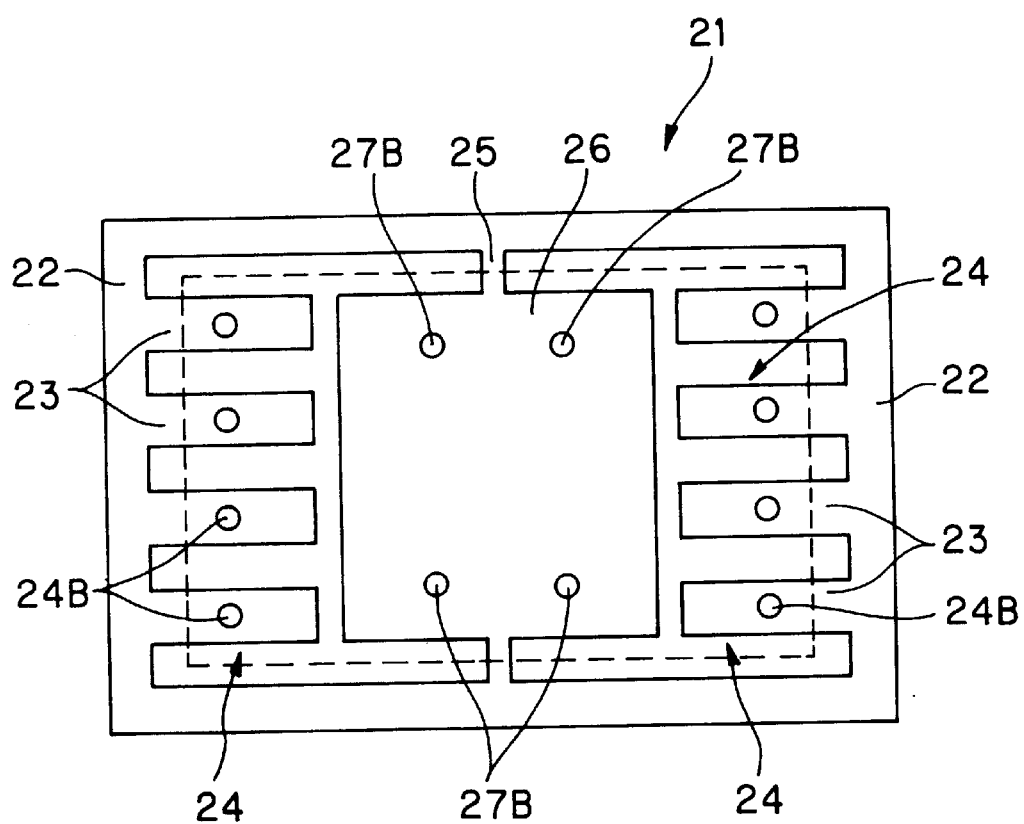
FIG. 8 is a plan view showing the rear side of the circuit member shown in FIG. 7.
Figure 9:
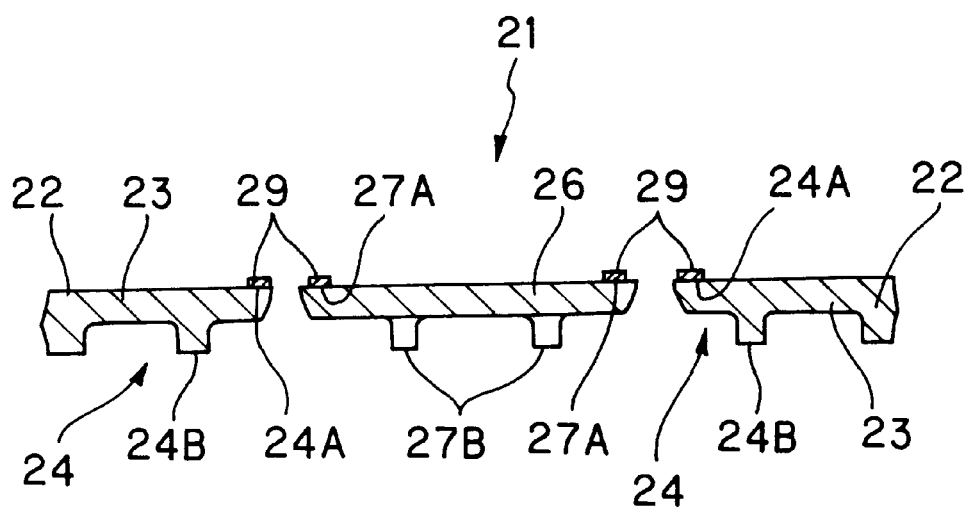
FIG. 9 is a longitudinal sectional view of the circuit member taken along line C—C in FIG. 7.

FIG. 7 is a plan view showing an embodiment of a circuit member of the invention, FIG. 8 is a plan view showing the rear side of the circuit member shown in FIG. 7, and FIG. 9 is a longitudinal sectional view of the circuit member taken along line C—C in FIG. 7. Additionally, a region surrounded with a chain line in FIG. 7 or 8 is a region of the circuit member for use in the manufacture of the semiconductor device.

In FIGS. 7 to 9, a circuit member 21 of the invention is provided with an outer frame member 22, plural terminal portions 24 mutually independently extended from the outer frame member 22 via connection leads 23 and a die pad 26 extended from the outer frame member 22 via connection leads 25.

An outer configuration and an inner opening configuration of the outer frame member 22 are rectangular. The connection leads 23 are extended from a pair of opposite sides defining an inner opening of the outer frame member 22 into the same plane. Furthermore, the connection leads 25 are extended from the other pair of opposite sides defining the inner opening of the outer frame member 22 into the same plane.

The terminal portions 24 are formed on tip ends of the connection leads 23, and integrally have inner terminals 24A on surfaces and outer terminals 24B on back surfaces. In the embodiment, as shown in FIG. 7, silver plating layers 29 are formed on the inner terminals 24A, and surfaces of the inner terminals 24A are positioned on the same plane.

The die pad 26 is supported by two connection leads 25 which are extended from the opposite sides of the inner opening of the outer frame member 22. Additionally, the die pad 26 integrally has inner terminals 27A on a surface and outer terminals 27B on a back surface. As shown in FIG. 7, the silver plating layers 29 are formed on the inner terminals 27A, and surfaces of the inner terminals 27A are positioned on the same plane formed by the surfaces of the inner terminals 24A.

The circuit member 21 can be formed of a 42 alloy (iron alloy containing 41% of nickel), a copper, a copper alloy or another material.

When the circuit member 21 of the invention is formed of a copper or copper alloy material, in the manufacture of the semiconductor device, at least a resin sealed region may be provided with a lamination constituted of a nickel plating layer and a palladium plating layer in the same manner as described in the resin-sealed semiconductor device of the invention shown in FIGS. 1 to 6. Moreover, when the circuit member 21 of the invention is formed of a 42 alloy (iron alloy containing 41% of nickel) or another iron alloy material, not of a copper or copper alloy material, the palladium plating layer may be formed directly on the iron alloy material.

Furthermore, the circuit member 21 of the invention may be constituted by placing an adhesive double coated tape with electrically insulating properties on the surface of the die pad 26. As the adhesive double coated tape, an adhesive double coated tape with adhesive layers formed on opposite surfaces of an electrically insulating base film, e.g., UX1W (manufactured by Kabushiki Kaisha Tomoegawa Seishisho) with RXF layers (adhesives manufactured by Kabushiki Kaisha Tomoegawa Seishisho) formed on opposite surfaces of UPLEX (electrically insulating base film manufactured by Ube Kosan Kabushiki Kaisha) can be used.

By using the circuit member 21 in a method of manufacturing a resin-sealed semiconductor device of the invention described later, the aforementioned resin-sealed semiconductor device 1 can be manufactured.

Additionally, the number of terminals in the circuit member 21, the arrangement of the terminals and the like are shown by way of illustration, and it is natural that the invention is not restricted to the embodiment.

Figure 10:
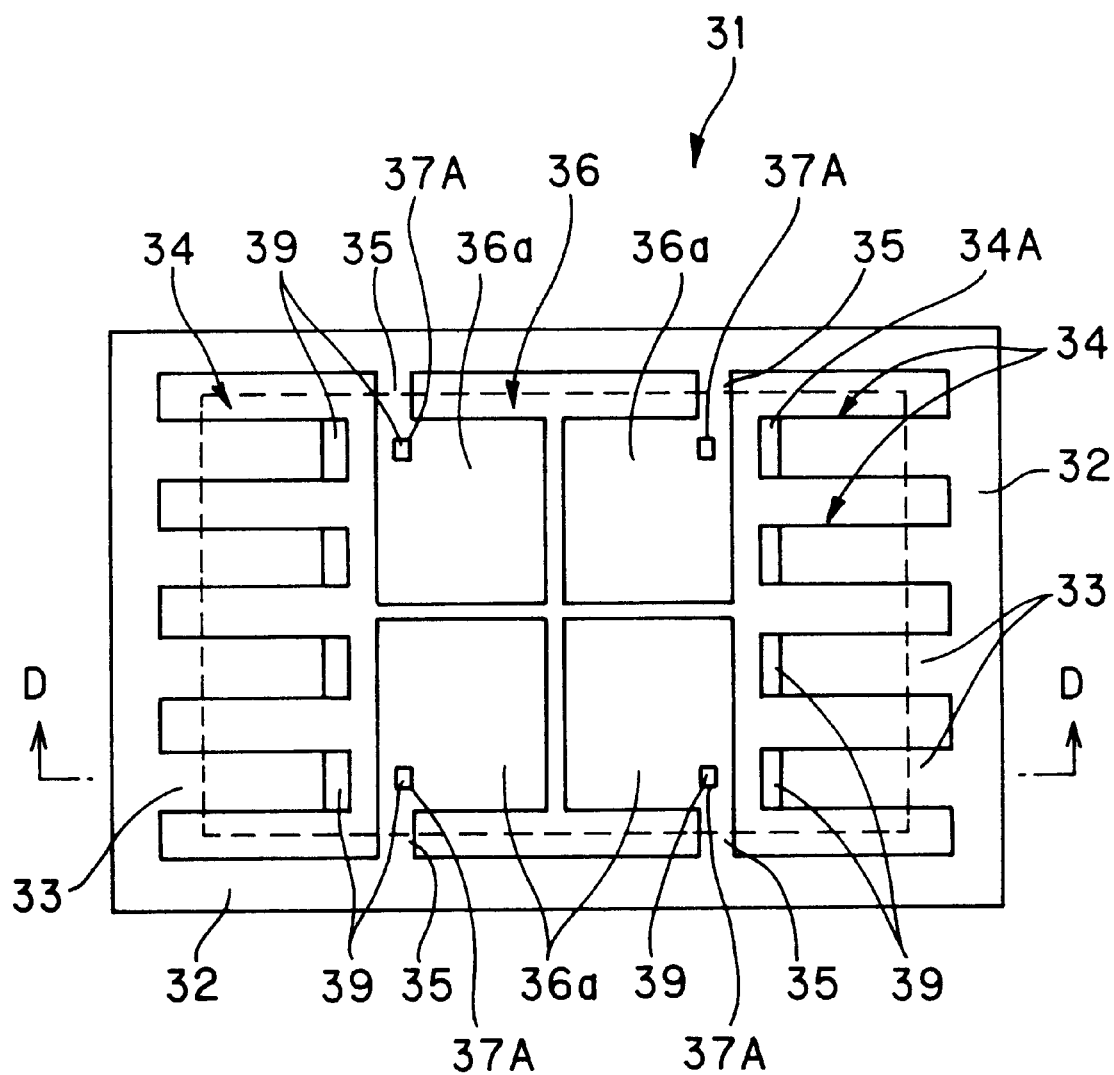
FIG. 10 is a plan view showing another embodiment of the circuit member of the invention.
Figure 11:
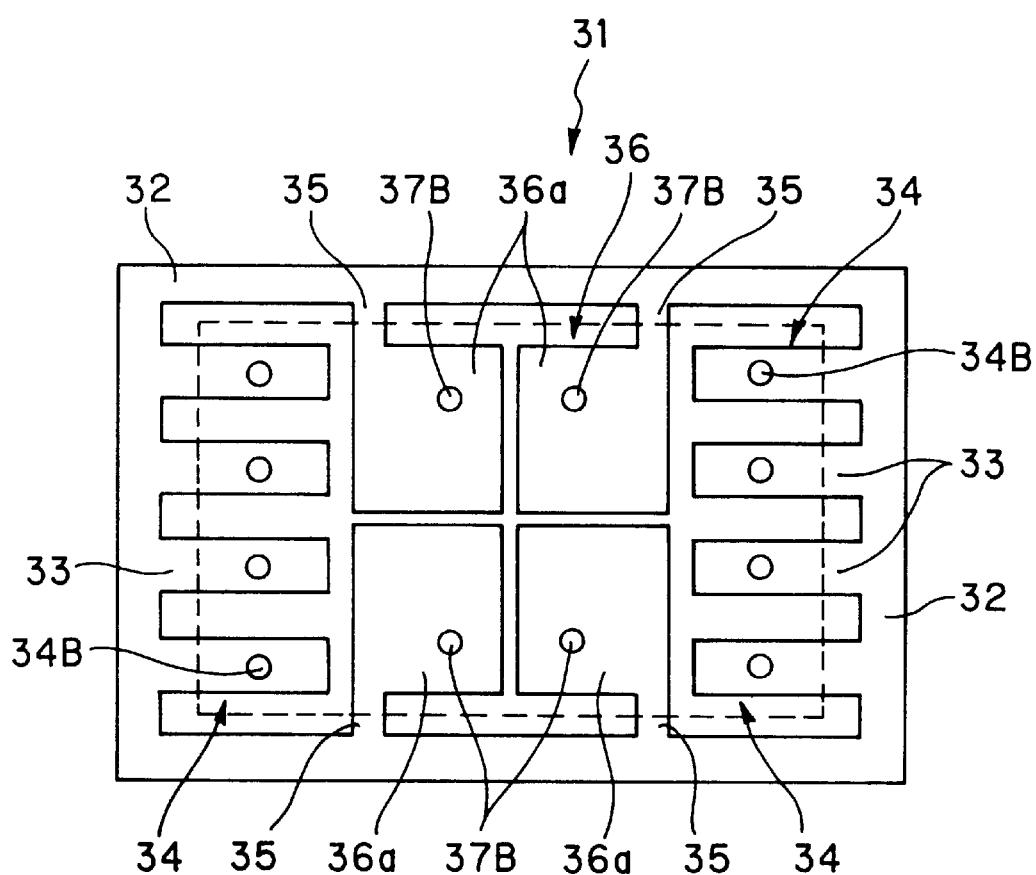
FIG. 11 is a plan view showing a rear side of the circuit member shown in FIG. 10.
Figure 12:
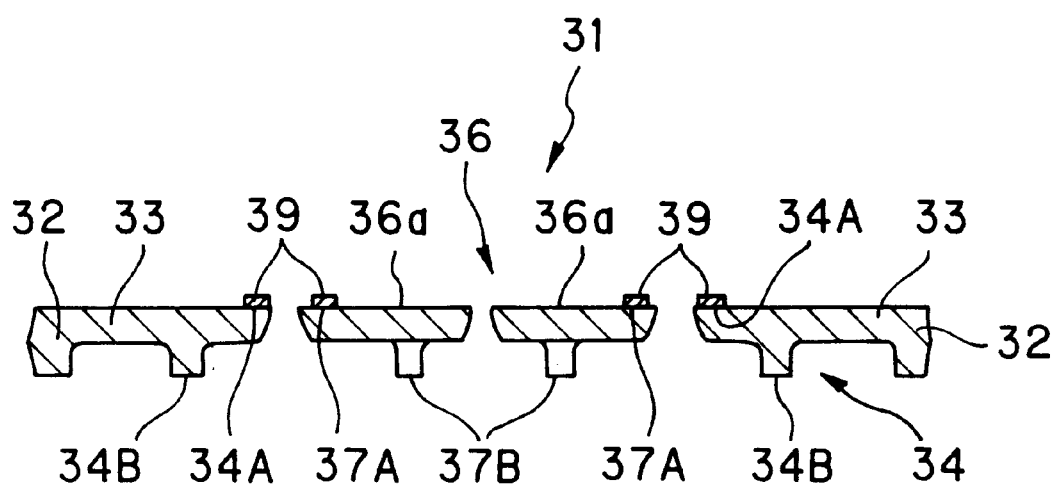
FIG. 12 is a longitudinal sectional view of the circuit member taken along line D—D in FIG. 10.

FIG. 10 is a plan view showing another embodiment of a circuit member of the invention, FIG. 11 is a plan view showing a rear side of the circuit member shown in FIG. 10, and FIG. 12 is a longitudinal sectional view of the circuit member taken along line D—D in FIG. 10. Additionally, a region surrounded with a chain line in FIG. 10 or 11 is a region of the circuit member for use in the manufacture of the semiconductor device.

In FIGS. 10 to 12, a circuit member 31 of the invention is provided with an outer frame member 32, plural terminal portions 34 mutually independently extended from the outer frame member 32 via connection leads 33, and a die pad 36 constituted of plural die pad pieces 36a which are extended from the outer frame member 32 via connection leads 35 and disposed apart from one another.

An outer configuration and an inner opening configuration of the outer frame member 32 are rectangular, and the connection leads 33 are extended from a pair of opposite sides defining an inner opening of the outer frame member 32 into the same plane. Furthermore, the connection leads 35 are extended from the other pair of opposite sides defining the inner opening of the outer frame member 32 into the same plane.

The terminal portions 34 are formed on tip ends of the connection leads 33, and integrally have inner terminals 34A on surfaces and outer terminals 34B on back surfaces. In the embodiment, as shown in FIG. 10, silver plating layers 39 are formed on the inner terminals 34A, and surfaces of the inner terminals 34A are positioned on the same plane.

The die pad 36 is constituted of four die pad pieces 36a supported by four connection leads 35 which are extended from the opposite sides of the inner opening of the outer frame member 32. Additionally, each of the die pad pieces 36a integrally has inner terminals 37A on a surface and outer terminals 37B on a back surface. As shown in FIG. 10, the silver plating layers 39 are formed on the inner terminals 37A, and surfaces of the inner terminals 37A are positioned on the same plane formed by the surfaces of the inner terminals 34A.

The circuit member 31 can be formed of a 42 alloy (iron alloy containing 41% of nickel), a copper, a copper alloy or another material. Furthermore, in the same manner as the circuit member 21, when the circuit member 31 is formed of a copper or copper alloy material, in the manufacture of the semiconductor device, at least a resin sealed region may be provided with a lamination constituted of a nickel plating layer and a palladium plating layer. Moreover, when the circuit member 31 is formed of a 42 alloy (iron alloy containing 41% of nickel) or another iron alloy material, not of a copper or copper alloy material, the palladium plating layer may be formed directly on the iron alloy material.

Furthermore, the circuit member 31 of the invention may be constituted by placing an adhesive double coated tape with electrically insulating properties on a surface of each die pad piece 36a constituting the die pad 36. As the adhesive double coated tape, an adhesive double coated tape with adhesive layers formed on opposite surfaces of an electrically insulating base film, e.g., UX1W (manufactured by Kabushiki Kaisha Tomoegawa Seishisho) with RXF layers (adhesives manufactured by Kabushiki Kaisha Tomoegawa Seishisho) formed on opposite surfaces of UPLEX (electrically insulating base film manufactured by Ube Kosan Kabushiki Kaisha) can be used.

By using the circuit member 31 in the method of manufacturing the resin-sealed semiconductor device of the invention as described later, the aforementioned resin-sealed semiconductor device 11 can be manufactured.

Additionally, the number of terminals in the circuit member 31, the arrangement of the terminals and the like are shown by way of illustration, and it is natural that the invention is not restricted to the embodiment.

Method of Manufacturing Resin-Sealed Semiconductor Device

A method of manufacturing the resin-sealed semiconductor device of the invention will be described.

FIGS. 13 and 14 are process views showing an embodiment of a method for manufacturing the resin-sealed semiconductor device of the invention, e.g., the resin-sealed semiconductor device 1 shown in FIGS. 1 to 3. Each process is shown in a longitudinal sectional view of the resin-sealed semiconductor device corresponding to FIG. 2.

Figure 13A:
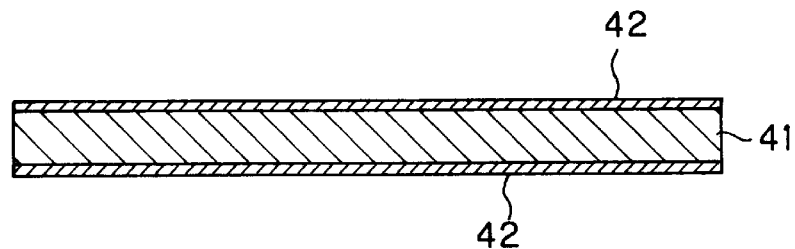
FIGS. 13A to 13D and 14A to 14D are process views showing a method of manufacturing the resin-sealed semiconductor device according to an embodiment of the invention.
Figure 13B:
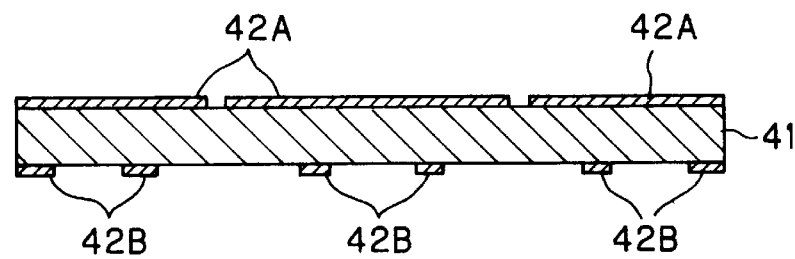

First, a photosensitive resist is applied to the surface and the back surface of a conductive board 41 and dried to form photosensitive resist layers 42 (FIG. 13A), which are exposed to light via desired photo masks and then developed to form resist patterns 42A and 42B (FIG. 13B). As the conductive board 41, a metal board (with a thickness of 100 to 250 $\mu$m) of the 42 alloy (Fe alloy with 41% of Ni), the copper, the copper alloy or the like can be used as aforementioned, and the conductive board 41 for use is preferably subjected to a cleaning process by degreasing both surfaces thereof or otherwise. Additionally, a known conventional photosensitive resist can be used.

Figure 13C:
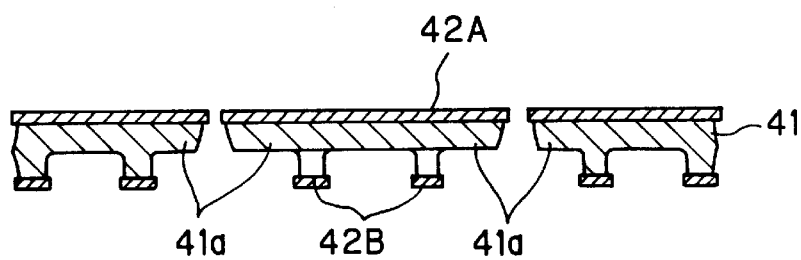

Subsequently, by using the resist patterns 42A and 42B as films resistant to etching agents, the conductive board 41 is etched with an etching liquid (FIG. 13C). For the etching liquid, an aqueous solution of ferric chloride is usually used to spray and etch both the surfaces of the conductive board 41. By adjusting an etching quantity in the etching process, a thickness of each thin-gage portion 41a can be regulated.

Figure 13D:
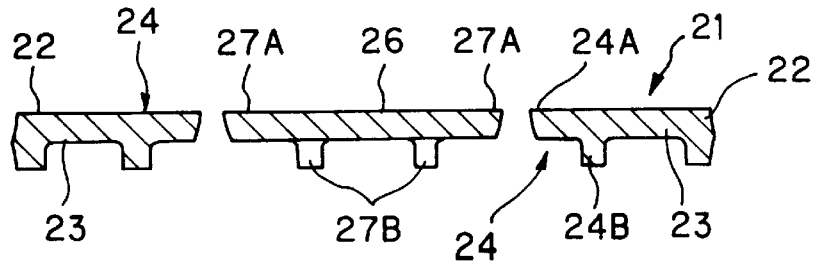

Subsequently, by peeling and removing the resist patterns 42A and 42B, the circuit member 21 of the invention can be obtained in which the terminal portions 24 and the die pad 26 are integrally interconnected to the outer frame member 22 via the connection leads 23 and 25 (not shown), respectively (FIG. 13D). In the circuit member 21, as clearly seen from FIG. 13D, the surfaces of the inner terminals 24A of the terminal portions 24 and the surfaces of the inner terminals 27A of the die pad 26 are positioned in the same plane.

Figure 14A:
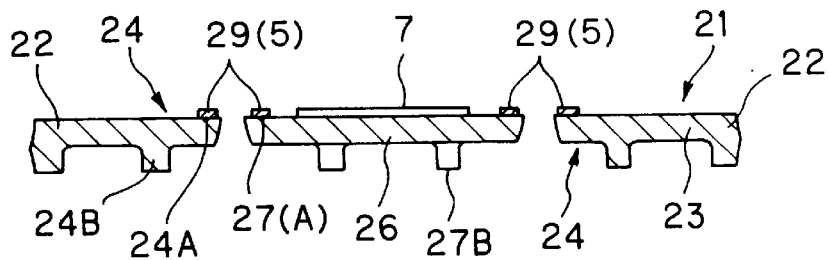

Subsequently, the silver plating layers 29(5) are formed in positions of the inner terminals 24A of the terminal portions 24 and in positions of the inner terminals 27A of the die pad 26 of the circuit member 21 of the invention manufactured as aforementioned, and the electrically insulating adhesive double coated tape 7 is further placed on the surface of the die pad 26 (FIG. 14A).

Figure 14B:
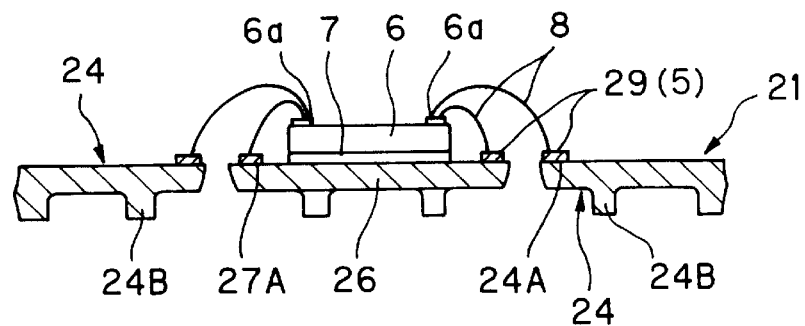

Subsequently, by fixing the side opposite to the circuit forming face of the semiconductor element 6 onto the surface of the die pad 26 via the electrically insulating adhesive double coated tape 7, the semiconductor element 6 is mounted. Subsequently, the terminals 6a of the mounted semiconductor element 6, the silver plating layers 29(5) on the inner terminals 24A of the terminal portions 24 and the silver plating layers 29(5) on the inner terminals 27A of the die pad 26 are electrically connected with the wires 8 (FIG. 14B).

Figure 14C:
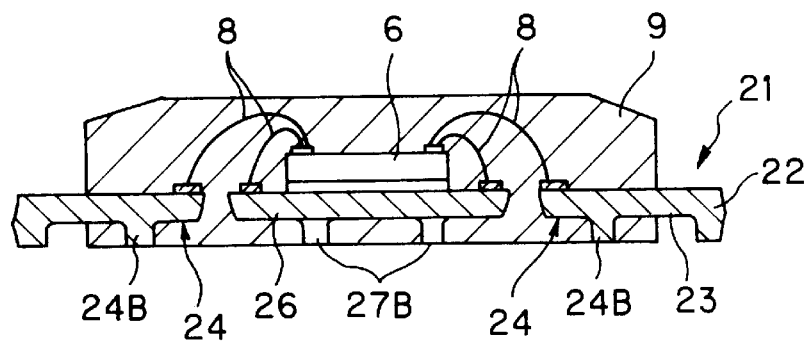

Subsequently, the terminal portions 24, the die pad 26, the semiconductor element 6 and the wires 8 are sealed in the sealing member 9 in such a manner that the outer terminals 24B and 27B are partially exposed to the outside (FIG. 14C).

Figure 14D:
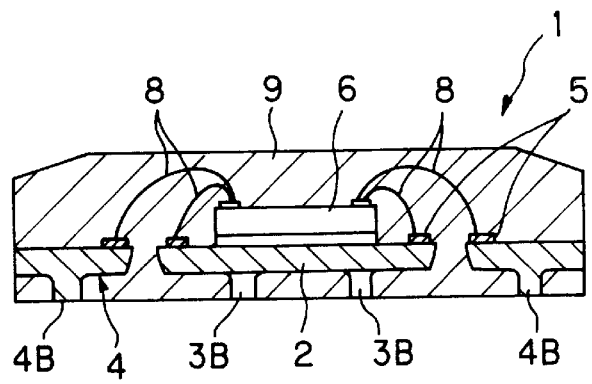

Subsequently, by cutting the connection leads of the circuit member 21 and removing the outer frame member 22, the semiconductor device 1 of the invention is obtained (FIG. 14D). Furthermore, the outer electrodes 10 constituted of solders can be formed on outer terminals 4B and 3B exposed to the outside. The outer electrodes 10 constituted of solders are formed by applying a solder paste through screen printing, reflowing or otherwise. It is sufficient to form the amount of solder layer necessary for connecting the circuit board and the resin-sealed semiconductor device.

In the manufacture of the circuit member 21, when the circuit member 21 is formed of a copper or copper alloy material, a lamination constituted of a nickel plating layer and a palladium plating layer may be formed in at least a resin sealed region in the manufacture of the semiconductor device in the same manner as described in the resin-sealed semiconductor device of the invention shown in FIGS. 1 to 6. When the circuit member 21 of the invention is formed of the 42 alloy (the iron alloy containing 41% of nickel) or another iron alloy material instead of the copper or copper alloy material, the palladium plating layer may be formed directly on the iron alloy material.

FIGS. 15 and 16 are process views showing an embodiment of a method for manufacturing the resin-sealed semiconductor device of the invention, e.g., the resin-sealed semiconductor device 11 shown in FIGS. 4 to 6. Each process is shown in a longitudinal sectional view of the resin-sealed semiconductor device corresponding to FIG. 5.

Figure 15A:
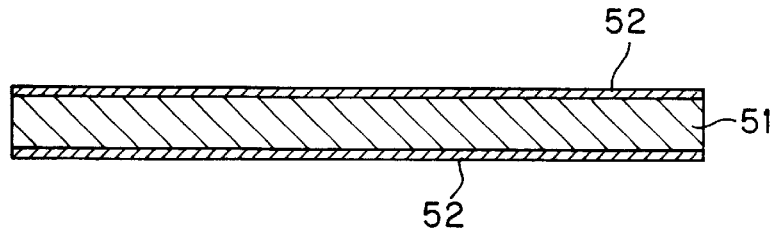
FIGS. 15A to 15D and 16A to 16D are process views showing the method of manufacturing the resin-sealed semiconductor device according to another embodiment of the invention.
Figure 15B:
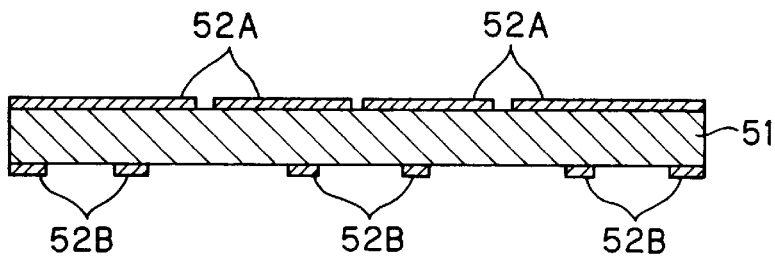

First, a photosensitive resist is applied to the surface and the back surface of a conductive board 51 and dried to form photosensitive resist layers 52 (FIG. 15A), which are exposed to light via desired photo masks and then developed to form resist patterns 52A and 52B (FIG. 15B). As the conductive board 51, a metal board (with a thickness of 100 to 250 μm) of the 42 alloy (Fe alloy with 41% of Ni), the copper, the copper alloy or the like can be used as aforementioned, and the conductive board 51 for use is preferably subjected to a cleaning process by degreasing both surfaces thereof or otherwise. Additionally, a known conventional photosensitive resist can be used.

Figure 15C:
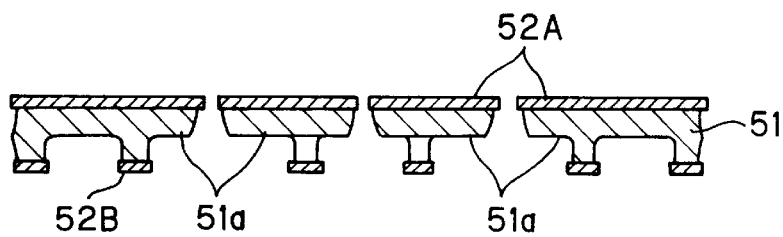

Subsequently, by using the resist patterns 52A and 52B as films resistant to etching agents, the conductive board 51 is etched with an etching liquid (FIG. 15C). For the etching liquid, an aqueous solution of ferric chloride is usually used to spray and etch both the surfaces of the conductive board 51. By adjusting an etching quantity in the etching process, a thickness of each thin-gage portion 51a can be regulated.

Figure 15D:
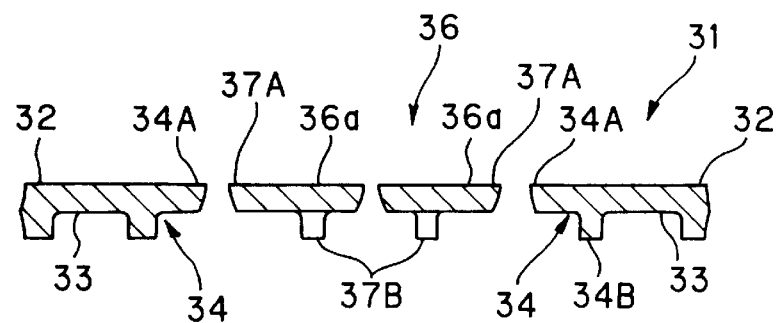

Subsequently, by peeling and removing the resist patterns 52A and 52B, the circuit member 31 of the invention can be obtained in which the terminal portions 34 and the die pad 36 are integrally interconnected to the outer frame member 32 via the connection leads 33 and 35 (not shown), respectively (FIG. 15D). In the circuit member 31, the die pad 36 is constituted of plural die pad pieces 36a which are extended from the outer frame member 32 via the connection leads 35 mutually apart from one another. Additionally, the surfaces of the inner terminals 34A of the terminal portions 34 and the surfaces of the inner terminals 37A of the die pad pieces 36a are positioned in the same plane.

Figure 16A:
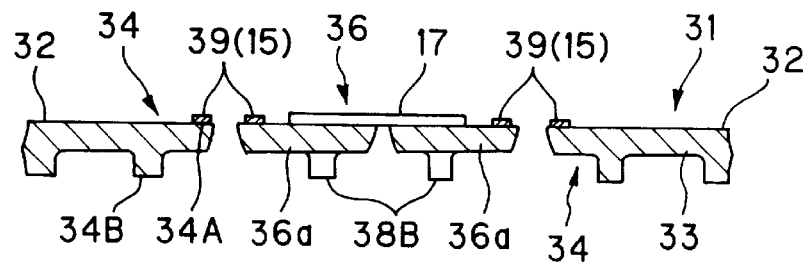

Subsequently, the silver plating layers 39(15) are formed in positions of the inner terminals 34A of the terminal portions 34 and in positions of the inner terminals 37A of the die pad pieces 36a constituting the die pad 36 in the circuit member 31 of the invention manufactured as aforementioned, and the electrically insulating adhesive double coated tape 17 is further placed on the surfaces of the die pad pieces 36a (FIG. 16A).

Figure 16B:
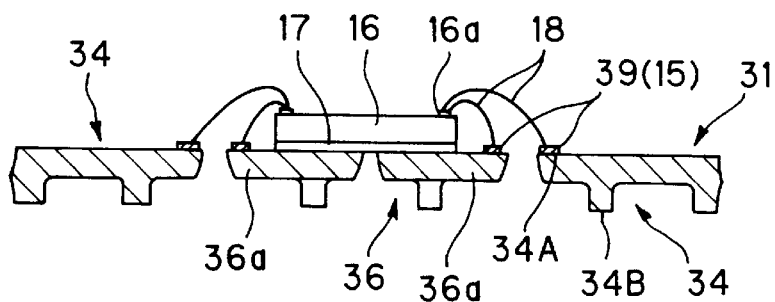

Subsequently, by fixing the side opposite to the circuit forming face of the semiconductor element 16 onto the surface of the die pad 36 via the electrically insulating adhesive double coated tape 17, the semiconductor element 16 is mounted. Subsequently, the terminals 16a of the mounted semiconductor element 16, the silver plating layers 39(15) on the inner terminals 34A of the terminal portions 34 and the silver plating layers 39(15) on the inner terminals 37A of the die pad 36 are electrically connected with the wires 18 (FIG. 16B).

Figure 16C:
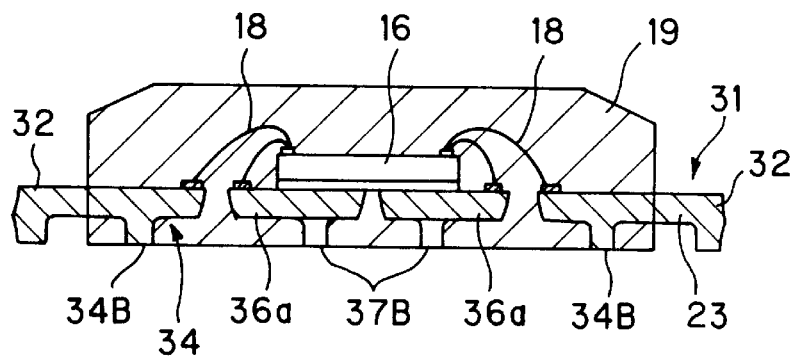

Subsequently, the terminal portions 34, the die pad 36, the semiconductor element 16 and the wires 18 are sealed in the sealing member 19 in such a manner that the outer terminals 34B and 37B are partially exposed to the outside (FIG. 16C).

Figure 16D:
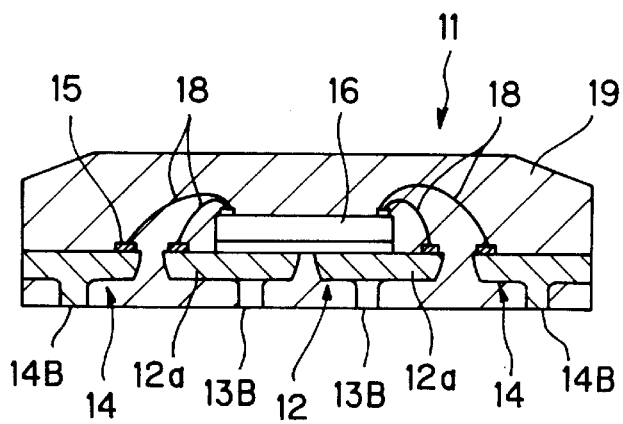

Subsequently, by cutting the connection leads of the circuit member 31 and removing the outer frame member 32, the semiconductor device 31 of the invention is obtained (FIG. 16D). Furthermore, the outer electrodes 20 constituted of solders can be formed on outer terminals 14B and 13B exposed to the outside. The outer electrodes 20 constituted of solders are formed by applying a solder paste through screen printing, reflowing or otherwise. It is sufficient to form the amount of solder layer necessary for connecting the circuit board and the resin-sealed semiconductor device.

In the manufacture of the circuit member 31, when the circuit member 31 is formed of a copper or copper alloy material, a lamination constituted of a nickel plating layer and a palladium plating layer may be formed in at least a resin sealed region in the manufacture of the semiconductor device in the same manner as described in the resin-sealed semiconductor device of the invention shown in FIGS. 1 to 6. When the circuit member 31 of the invention is formed of the 42 alloy (the iron alloy containing 41% of nickel) or another iron alloy material instead of the copper or copper alloy material, the palladium plating layer may be formed directly on the iron alloy material.

EXAMPLES

Concrete examples of the invention will be described to further detail the invention.

Example 1

Preparation of Circuit Member

A copper board having a thickness of 0.15 mm (EFTEC64T-1/2H manufactured by Furukawa Denki Kogyo Kabushiki Kaisha) was prepared as the conductive board, the degreasing process and the cleaning process were performed, and an ultraviolet-curing resist (OFPR1305 manufactured by Tokyo Oka Kogyo Kabushiki Kaisha) was applied to both surfaces of the copper board in an application/flowing method and dried. Subsequently, resist layers on the surface and the back surface were exposed to light via predetermined photo masks, respectively, and developed to form resist patterns. Thereafter, both the surfaces of the copper board were sprayed with an aqueous solution of ferric chloride and etched. After cleaning, an organic alkaline solution was used to peel and remove the resist patterns. Thereby, a circuit member was obtained in which four outer terminals were integrally provided on the back surface of a die pad.

Subsequently, after silver plating layers (thickness of about 5 $\mu$m) were formed on inner terminal surfaces of the die pad and inner terminal surfaces of terminal portions, an electrically insulating adhesive double coated tape (UH1W manufactured by Tomoegawa Seishisho Kabushiki Kaisha) was placed on a predetermined position of the surface of the die pad.

Preparation of Semiconductor Device

By pressing and attaching the side opposite to a circuit forming face of a semiconductor element (thickness of about 0.25 mm) onto the adhesive double coated tape on the surface of the die pad of the circuit member and heating (140° C.) and fixing the semiconductor element, the semiconductor element was mounted. Subsequently, the silver plating layers on the inner terminals of the die pad of the circuit member and the silver plating layers on the inner terminals of the terminal portions were connected to terminals of the mounted semiconductor element with metal wires. Thereafter, the terminal portions, the die pad, the semiconductor element and the metal wires were sealed in a resin material (MP-7400 manufactured by Nitto Denko Kabushiki Kaisha) in such a manner that outer terminals were partially exposed to the outside.

Subsequently, connection leads of the circuit member were cut and an outer frame member was removed, and balls of solders were bonded to outer terminals exposed to the outside to form outer electrodes.

In the resin-sealed semiconductor device prepared as aforementioned, the number of outer terminals is 48 pins (among these, four pins are outer terminals on the back surface of the die pad). Its outer dimension is as compact as 6 mm by sides and very thin as 0.8 mm. Additionally, the lead inductance of the resin-sealed semiconductor device is 5 to 7 nH.

As a comparative example, a circuit member provided with no outer terminals on a back surface of a die pad was prepared in the same manner as the aforementioned circuit member, and a resin-sealed semiconductor device having 44 pins of outer terminals was manufactured by using the circuit member. As a result of measurement, the lead inductance of the resin-sealed semiconductor device is 7 to 9 nH, which is larger than that of the resin-sealed semiconductor device described above of the invention.

Example 2

A copper board having a thickness of 0.15 mm (EFTEC64T-1/2H manufactured by Furukawa Denki Kogyo Kabushiki Kaisha) was prepared as a conductive board, and a circuit member was prepared in which four outer terminals were integrally provided on a back surface of a die pad in the same manner as the first example.

Subsequently, by using a micro etching liquid (CZ8100) manufactured by MEC Kabushiki Kaisha, the circuit member was subjected to a rough-surface processing. Through the rough-surface processing, the entire surface of the circuit member had a center line average roughness Ra according to JIS B0601 of 0.2 $\mu$m.

Subsequently, by using a nickel plating bath (WHN manufactured by Kojundo Kagaku Kabushiki Kaisha), a nickel plating layer (thickness of 1 $\mu$m) was formed on the circuit member. The center line average roughness Ra according to JIS B0601 of the nickel plating layer was 0.050 $\mu$m.

Subsequently, a palladium plating layer (thickness of 0.1 $\mu$m) was formed on the nickel plating layer.

By using the circuit member, a resin-sealed semiconductor device was prepared in the same manner as the first embodiment.

In the resin-sealed semiconductor device prepared as aforementioned, the number of outer terminals is 48 pins (among these, four pins are outer terminals on the back surface of the die pad). Its outer dimension is as compact as 6 mm by sides and very thin as 0.8 mm. Additionally, the lead inductance of the resin-sealed semiconductor device is 5 to 7 nH.

What is claimed is:

1. A circuit member of a resin-sealed semiconductor device which comprises:

an outer frame member; plural terminal portions extended from the outer frame member via connection leads independent of one another; and a die pad extended from said outer frame member via connection leads, the terminal portions integrally having inner terminals on surfaces and outer terminals on back surfaces, inner terminal surfaces of the terminal portions being positioned on substantially the same plane, said die pad being integrally provided with plural inner terminals on a surface and plural outer terminals on a back surface.

2. The circuit member according to claim 1 wherein at least a resin sealed region is subjected to a rough-surface processing, on which a nickel plating layer and a palladium plating layer are formed in sequence.

3. The circuit member according to claim 2 wherein a material is a copper alloy.

4. The circuit member according to claim 2 wherein a rough-surface processed surface has a center-line average roughness Ra according to JIS B0601 of 0.1 $\mu$m or more and a surface of the nickel plating layer has a center-line average roughness Ra according to JIS B0601 of 0.045 $\mu$m or more.

5. The circuit member according to claim 1 wherein at least a resin sealed region is subjected to a rough-surface processing, on which a palladium plating layer is formed.

6. The circuit member according to claim 5 wherein a material is an iron alloy.

7. The circuit member according to claim 5 wherein a rough-surface processed surface has a center-line average roughness Ra according to JIS B0601 of 0.1 $\mu$m or more.

8. A circuit member of a resin-sealed semiconductor device which comprises:

an outer frame member; plural terminal portions extended from the outer frame member via connection leads independent of one another; and a die pad extended from said outer frame member via connection leads, the terminal portions integrally having inner terminals on surfaces and outer terminals on back surfaces, inner terminal surfaces of the terminal portions being positioned on substantially the same plane, said die pad being constituted by arranging plural die pad pieces extended from the outer frame member via connection leads apart from one another on substantially the same plane, said die pad pieces being integrally provided with inner terminals on surfaces and outer terminals on back surfaces.

9. The circuit member according to claim 8 wherein at least a resin sealed region is subjected to a rough-surface processing, on which a nickel plating layer and a palladium plating layer are formed in sequence.

10. The circuit member according to claim 9 wherein a material is a copper alloy.

11. The circuit member according to claim 9 wherein a rough-surface processed surface has a center-line average roughness Ra according to JIS B0601 of 0.1 $\mu$m or more and a surface of the nickel plating layer has a center-line average roughness Ra according to JIS B0601 of 0.045 $\mu$m or more.

12. The circuit member according to claim 8 wherein at least a resin sealed region is subjected to a rough-surface processing, on which a palladium plating layer is formed.

13. The circuit member according to claim 12 wherein a material is an iron alloy.

14. The circuit member according to claim 12 wherein a rough-surface processed surface has a center-line average roughness Ra according to JIS B0601 of 0.1 $\mu$m or more.

* * * * *